United States Patent [19]

Scott

[11] 4,062,007
[45] Dec. 6, 1977

[54] SOLID-STATE DELAY TIMED SWITCHING CIRCUIT

[75] Inventor: Charles E. Scott, Noblesville, Ind.

[73] Assignee: P. R. Mallory & Co. Inc., Indianapolis, Ind.

[21] Appl. No.: 724,346

[22] Filed: Sept. 17, 1976

[51] Int. Cl.² .............................................. G08B 1/00
[52] U.S. Cl. ................................ 340/309.1; 307/141; 340/309.4
[58] Field of Search ..................... 307/141; 340/309.1, 340/309.4

[56] References Cited

U.S. PATENT DOCUMENTS 3,973,135   8/1976   Scott .................................... 307/141

Primary Examiner—Harold I. Pitts
Attorney, Agent, or Firm—Hoffmann, Meyer & Coles

[57] ABSTRACT

A solid-state delay timed switching circuit includes a delay timing means for delaying the start of an operational sequence. A function timing means is provided for timing the operational sequence, an alarm timing means for timing an audible alarm at the completion of an operational sequence, a power switching means, a power supply and a power turn-off means to de-energize the power switching means.

11 Claims, 2 Drawing Figures

SOLID-STATE DELAY TIMED SWITCHING CIRCUIT

BACKGROUND OF THE INVENTION

Generally speaking, the present invention relates to a solid-state timed switching circuit which comprises in combination a power switching means, a single delay timing means which is connected to the power supply means and provides a time delay before power is turned on through a diode and triac to a function timing means, a function timing means which is connected to the delay timing means for timing an operational sequence for predetermined times, a power turn-off means which is connected directly to the function timing means to de-energize the power switching means without delay at the conclusion of the timing cycle of the function timing means, and an alarm timing means which is responsive to the power turn-off means providing an audible alarm at the conclusion of the timing cycle of the function timing means.

The present invention pertains to timed switching circuits and more particularly to a delay timed switching circuit which provides a delayed start to a timed operational sequence and includes solid-state switching devices. The present invention is a new combination which includes a timer for an appliance as disclosed in Schmidgall U.S. Pat. No. 3,767,937 dated Oct. 23, 1973, a timer switch as disclosed in Scott U.S. Pat. No. 3,846,748 dated Nov. 5, 1974, and a single delay timing means and is an improvement over the prior art because of its complete solid-state structure.

Because of the increasing variety of desired uses for timed switching circuits and the complexity of functions to be controlled thereby, it has become necessary that timed switching circuits be more compactly designed and at the same time possess improved timing accuracy and reliability. It has also become desirable in many applications to delay the start of timing cycles until some condition precedent to the proper function of the operational sequence has been completed. These requirements and others have become particularly desirable in the application of timed switching circuits to microwave ovens where the compact design of such units is coupled with the need to provide increased timing accuracy, short response time and delayed starts of the cooking system. Functions similar to these have previously been accomplished with electromechanical combinations of switches and other devices; however, such combinations are physically larger, have a longer response time and are less accurate than combinations of solid-state devices performing the same or similar functions.

SUMMARY OF THE INVENTION

A feature of the present invention is the provision of a solid-state delay timed switching circuit comprising, in combination a power switching means, a power supply means connected to the power switching means, a single delay timing means connected to the power supply means, a function timing means responsive to the delay timing means, a power turn-off means responsive to the function timing means an alarm timing means responsive to the power turn-off means. Another feature of the present invention is the provision of a single delay timing means, a funtion timing means, a power turn-off means, and an alarm timing means which include solid-state switching devices. Another feature of the present invention is the provision of a single delay timing means which includes a first programmable unijunction transistor and a first bi-directional semiconductor switch. Another feature of the present invention is the utilization of the first bi-direction semiconductor switch to turn-on the function timing means after a delayed time period has elapsed. Another feature of the present invention is the provision of a function timing means having a comparator means which includes a programmable unijunction transistor. Yet another feature of the present invention is a reliable power turn-off means which by utilizing a second bi-directional semiconductor switch responds without delay to the conclusion of the timing cycle of the function timing means by de-energizing the power switching means. Still another feature of the present invention is an alarm timing means including a uni-directional semiconductor switch which turns-on an audible alarm for a predetermined period of time in response to the power turn-off means.

These and other features of the invention will become apparent from the following description and accompanying drawings which follow.

DESCRIPTION OF THE PREFERRED EMBODIMENT

Figure 1:
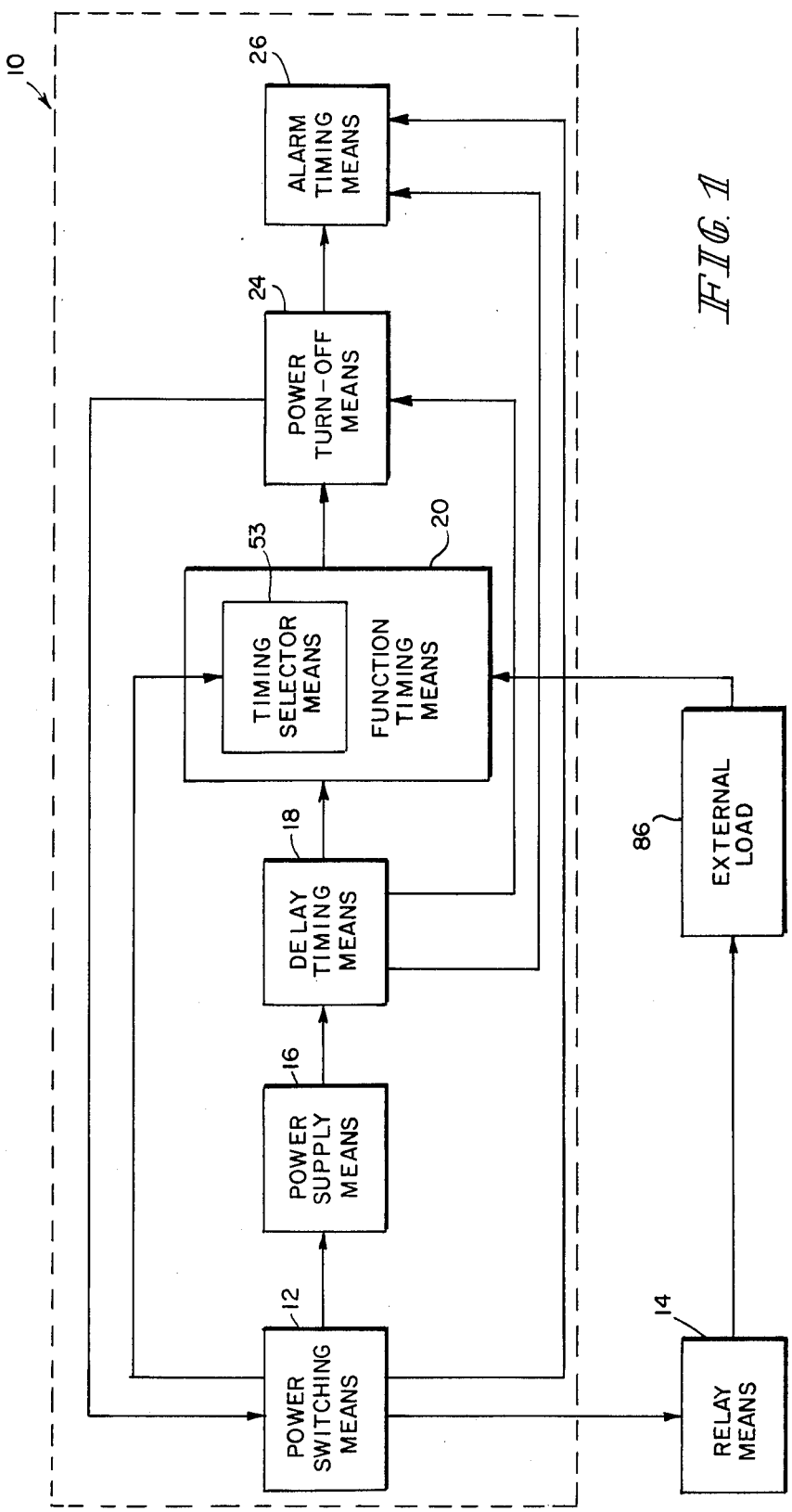
FIG. 1 is a block diagram showing the combination of the elements of the present invention, how they relate to each other, and how they relate to an external relay and load.

Referring now to FIG. 1, delay timed switching circuit 10 includes, in combination, a power switching means 12, a power supply means 16, a single delay timing means 18, a function timing means 20, a power turn-off means 24 and an alarm timing means 26. The delay timed switching circuit may, through power switching means 12 activate an external load 86, such as a microwave oven, through a relay means 14. As will become apparent, the timing cycle of function timing means 20 which times the operational sequence of load 86 will be delayed by delay timing means 18 to allow certain conditions precedent to be performed. Once delayed, the operational sequence of load 86 will operate for a predetermined time preselected by function timing means 20 until the power switching means 12 is de-energized through power turn-off means 24. The de-energizing of power switching means 12 actuates alarm timing means 26 which in turn sounds an audible alarm for a predetermined time. As shown, activation of power switching means 12 activates power supply means 16. Activation of power switching means 12 also simultaneously activates switching means 22, FIG. 2. Power supply means 16 activates delay timing means 18 which in turn, upon the completion of its timing cycle, activates function timing means 20. As previously indicated, although switching means 22 is functionally a part of function timing means 20 such switching means should be constructed unitarily with power switching means 12.

Figure 2:
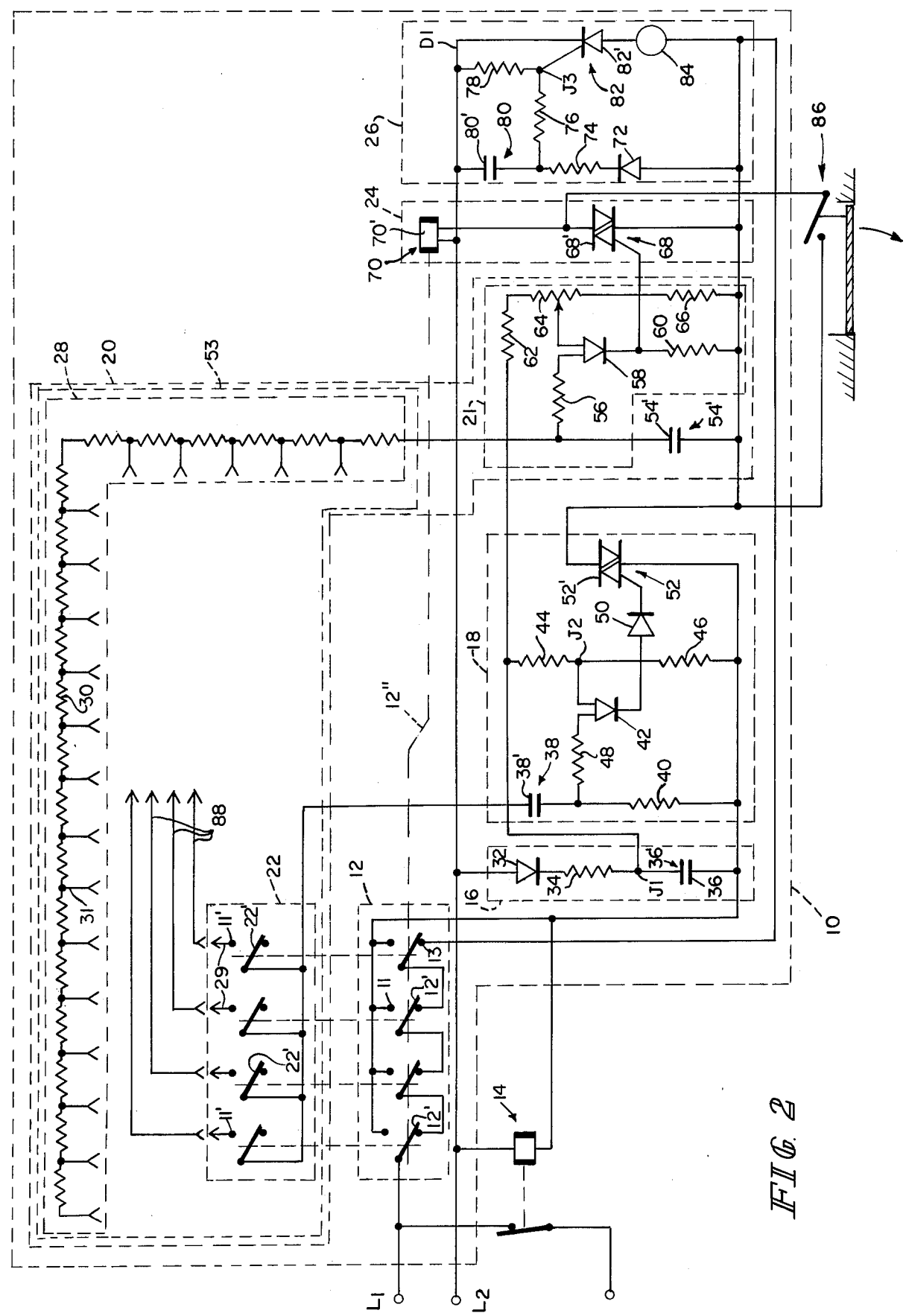
FIG. 2 is a circuit diagram of the present invention showing the detailed connection of the various elements and components thereof.

Referring to FIG. 2, the delay timed switching circuit 10 is connected across an external power source at connections $L_1$ and $L_2$. Power switching means 12 includes a plurality of switches 12' and switching means 22 includes a plurality of switches 22'. As shown, power switching means 12 and switching means 22 should be constructed unitarily with the switch construction being generally of the push button type having double contacts 11 and 11'. One contact 11' of such switch construction corresponds to switching means 22 and the other contact 11 corresponds to power switching means 12. Power supply means 16 includes a series combination of diode 32, resistor 34 and capacitor 36. The power supply means 16 converts AC current to DC current which is supplied to the timing elements of the circuit; however, the circuit may also be operated utilizing an external DC power source. Delay timing means 18 includes capacitance means 38, timing resistor 40, load resistor 48, a voltage divider network comprising resistors 44 and 46, a programmable unijunction transistor 42, diode 50 and a bi-directional semiconductor switch 52 which as shown in the present embodiment may be a triac 52'. Capacitance means 38 includes a timing capacitor 38'. The anode of programmable unijunction transistor 42 is connected to a first side of load resistor 48 with the second side of load resistor 48 being connected at the junction J1 connecting timing capacitor 38' and timing resistor 40, its gate is connected to the junction J2 connecting voltage divider resistors 44 and 46, and its cathode is connected to the anode of diode 50. The cathode of diode 50 is in turn connected to the gate of bi-directional semiconductor switch 52 completing the delay timing circuit. The timing cycle of function timing means 20 is started at the conclusion of the timing cycle of delay timing means 18 by bi-directional semiconductor switch 52.

Function timing means 20 includes a comparator means 21, a timing selector means 53 and a capacitance means 54. Timing selector means 53 is connected between power supply means 16 and capacitance means 54 and includes a bank of impedance means 28 such as a bank of timing resistors 30 and switching means 22. The timing resistors 30 are electrically connected in series by female terminal plugs 31 between each resistor. The bank of switches 22' are electrically coupled to male terminals 29 such that a means 88 may be used to selectively couple the switches 22' to the resistor(s) 30. Such means 88 could include patch cords used to selectively couple a male terminal to a female terminal. In this manner, various resistance values may be obtained so as to vary the preselected time periods such that the function timing means will be operable through the various combinations of the capacitance means 54 and the bank of resistor(s) 30. Capacitance means 54 includes a timing capacitor 54'. Included as part of the comparator means 21 is a programmable unijunction transistor 58 and a voltage divider network comprising resistor 62, 64 and 66, resistor 64 being a variable resistor. The gate of programmable unijunction transistor 58 is connected to the variable resistor 64, its anode is connected to the bank of impedance means 28 through load resistor 56, and its cathode is connected to a bi-directional semiconductor switch 68 of the power turn-off means 24 and to ground through load resistor 60.

Power turn-off means 24 includes a relay means 70 connected in series with bi-directional semiconductor switch 68. Relay means 70 includes a solenoid 70' and bi-directional semiconductor switch 68 as shown in the present embodiment may be a triac 68'. Bi-directional semiconductor switch 68 is connected anode to the solenoid 70, cathode to ground, and gate to the comparator means 21 of function timing means 20.

Alarm timing means 26 is responsive to power turn-off means 24. Alarm timing means 26 includes a diode 72, timing resistor 74, capacitance means 80, voltage divider resistors 76 and 78, a uni-directional semiconductor switch 82, and an electromechanical buzzer 84. Uni-directional semiconductor switch as shown in the present embodiment 82 may be a silicon controlled rectifier (SCR) 82'. Diode 72, resistor 74, and capacitance means 80 are connected in series and voltage divider resistors 76 and 78 are connected in parallel combination with capacitance means 80. The gate of uni-direction semiconductor switch 82 is connected to the junction J3 between voltage divider resistors 76 and 78, its cathode is connected to the first side D1 of delay timed switching circuit 10, and its anode is connected in series to electromechanical buzzer 84 which in turn is connected to the normally open contacts 13 of power switching means 12.

In operation, when any one of the number of push buttons corresponding to the number of switches 12' or 22' is fully depressed, two switch contacts 11 and 11' are latched in the closed position by a spring loaded latch 12" which is connected to solenoid 70'. Contacts 11 and 13 of the power switching means 12 control power to external relay 14, power supply means 16, and voltage divider resistors 44 and 46 of the delay timing means 18. Timing intervals are preselected by utilizing means 88, which could include patch cords having male and female connectors to selectively couple a male terminal plug 29 electrically coupled to switch 22' to a female terminal plug 31 electrically coupled to resistor(s) 30. In this manner various resistance values may be obtained so as to vary the preselected time periods for each individual switching means 22'. The individual switching means 22' connect the preselected timing resistor(s) 30 between the power supply means 16 and timing capacitor 54'; however no power is supplied to function timing means 20 because bi-directional semiconductor switch 52 of delay timing means 18 is turned-off. As current flows from power supply means 16 through timing resistor 40 the charge on timing capacitor 38' begins to rise. As the timing capacitor 38' charges, the voltage at the anode of PUT 42 drops. When the anode voltage reaches a point below the gate voltage set by resistors 44 and 46, PUT 42 conducts and supplies current to the gate of bi-directional semiconductor switch 52 through blocking diode 50. This current turns-on bi-directional semiconductor switch 52 and voltage is in turn supplied to function timing means 20. As current now begins to flow from the power supply means 16 through the timing resistor(s) 30 to timing capacitor 54', the voltage on timing capacitor 54' begins to rise. When the voltage appearing across timing capacitor 54' exceeds the anode voltage of PUT 58 as set by voltage divider resistors 62, 64, and 66, PUT 58 conducts which applies a voltage to the gate of bi-directional semiconductor switch 68 and causes it to conduct. When bi-directional semiconductor switch 68 conducts, current flows through solenoid 70' and activates the latch bar 12" which releases switches 12' and 22' placing them in "open" position. With switches 12' and 22' in open position, external relay 14 and power supply means 16 are de-energized shutting off the external load and ending the timing cycle of the operational sequence; however, during the timing cycle of function timing means 20, timing capacitor 80' has been charging through diode 72 and timing resistor 74. Since diode 72 serves to block the return path of current, timing capacitor 80' remains charged until power switching means 12 is returned to open position which allows a return path through uni-directional semiconductor switch 82 and electromechanical buzzer 84. Accordingly, when power switching means 12 returns to open position uni-directional semiconductor switch 82 is turned on by the voltage stored in timing capacitor 80' and as uni-directional semiconductor switch 82 begins to conduct buzzer 84 is turned on. As soon as timing capacitor 80' discharges through uni-directional semiconductor 82 and buzzer 84 both of such devices turn off ending the timing cycle of the alarm timing means 26.

What is claimed is:

1. A solid-state delay timed switching circuit comprising, in combination:
   a. a power switching means,
   b. a power supply means responsive to said power switching means,
   c. a single delay timing means electrically coupled to said power supply means for providing a time delay before the start of an operational sequence of functions which includes a first bi-directional semiconductor switch,
   d. a function timing means responsive to said delay timing means for timing an operational sequence of functions for predetermined times,
   e. a power turn-off means directly responsive to said function timing means for de-energizing said power switching means at the conclusion of the timing cycle of said function timing means which includes a second bi-directional semiconductor switch, and
   f. an alarm timing means responsive to said power turn-off means providing an audible alarm at the conclusion of the timing cycle said function timing means for a predetermined time.

2. The combination as recited in claim 1, wherein said delay timing means further includes a first programmable unijunction transistor.

3. The combination as recited in claim 2, wherein the cathode of said first programmable unijunction transistor is connected to the anode of said diode and the cathode of the diode is connected to the gate of said first bi-directional semiconductor switch.

4. The combination as recited in claim 3 wherein said first bi-directional semiconductor switch includes a triac.

5. The combination as recited in claim 1, wherein said function timing means includes a bank of switching means, a bank of impedance means, a patch cord coupling at least one of said switching means to at least one of said impedance means, and capacitance means connected in series to said bank of impedance means.

6. The combination as recited in claim 5, wherein said function timing means further includes a comparator means.

7. The combination as recited in claim 6, wherein said comparator means includes a second programmable unijunction transistor.

8. The combination as recited in claim 1, wherein said power turn-off means further includes a relay means.

9. The combination as recited in claim 1, wherein said second bi-directional semiconductor switch includes a triac.

10. The combination as recited in claim 1, wherein said alarm timing means includes a uni-directional semiconductor switch and an electromechanical buzzer.

11. The combination as recited in claim 10, wherein said uni-directional semiconductor switch includes a silicon-controlled rectifier.

* * * * *